United States Patent
Lee et al.

(10) Patent No.: US 7,473,959 B2
(45) Date of Patent: Jan. 6, 2009

(54) NON-VOLATILE SEMICONDUCTOR MEMORY DEVICES AND METHODS OF FABRICATING THE SAME

(75) Inventors: Sung-Hae Lee, Gyeonggi-do (KR);
Chang-Hyun Lee, Gyeonggi-do (KR);
Ki-Hyun Hwang, Gyeonggi-do (KR);
Sung-Kweon Baek, Gyeonggi-do (KR);
Kwang-Min Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 11/601,505

(22) Filed: Nov. 17, 2006

(65) Prior Publication Data

US 2007/0063265 A1   Mar. 22, 2007

Related U.S. Application Data

(63) Continuation-in-part of application No. 11/043,485, filed on Jan. 26, 2005, now Pat. No. 7,400,009.

(30) Foreign Application Priority Data

Jun. 28, 2001 (KR) .................. 2001-0037421
Jan. 31, 2002 (KR) .................. 2002-0005622
May 25, 2006 (KR) .............. 10-2006-0047231

(51) Int. Cl.
*H01L 29/788* (2006.01)

(52) U.S. Cl. ............................ 257/316

(58) Field of Classification Search ........ 257/314–317, 257/E29.129; 438/201, 257
See application file for complete search history.

(56) References Cited

U.S. PATENT DOCUMENTS

| | | | |
|---|---|---|---|
| 4,630,086 A | 12/1986 | Sato et al. | |
| 4,870,470 A | 9/1989 | Bass, Jr. et al. | |
| 5,270,298 A | 12/1993 | Ramesh | |
| 5,424,567 A | 6/1995 | Chen | |
| 5,536,667 A | 7/1996 | Cho | |
| 5,583,067 A | 12/1996 | Sanchez | |
| 5,619,051 A | 4/1997 | Endo | |
| 5,768,192 A | 6/1998 | Eitan | |
| 5,923,056 A | 7/1999 | Lee et al. | |
| 6,011,725 A | 1/2000 | Eitan | |

(Continued)

FOREIGN PATENT DOCUMENTS

JP   63-000141   1/1988

(Continued)

*Primary Examiner*—Nathan W Ha
(74) *Attorney, Agent, or Firm*—Myers Bigel Sibley & Sajovec, P.A.

(57) ABSTRACT

Nonvolatile memory devices and related methods of fabricating nonvolatile memory devices are disclosed. A nonvolatile memory device includes a tunnel insulation film on a semiconductor substrate, a charge-trapping layer on the tunnel insulation film, a block insulation film on the charge-trapping layer, and a gate electrode on the blocking insulation film. The blocking insulation film includes a stacked film structure of a high-dielectric film and a barrier insulation film. The high-dielectric film has a first potential barrier relative to the charge-trapping layer. The barrier insulation film has a second potential barrier relative to the charge-trapping layer which is higher than the first potential barrier. The blocking insulation film has a thickness in a range of about 5 Å to about 15 Å.

10 Claims, 16 Drawing Sheets

U.S. PATENT DOCUMENTS

| | | | |
|---|---|---|---|
| 6,141,256 | A | 10/2000 | Forbes |
| 6,163,049 | A | 12/2000 | Bui |
| 6,166,958 | A * | 12/2000 | Naruke et al. .......... 365/185.24 |
| 6,204,125 | B1 | 3/2001 | Lee et al. |
| 6,225,646 | B1 | 5/2001 | Gardner et al. |
| 6,236,076 | B1 | 5/2001 | Arita et al. |
| 6,287,915 | B1 | 9/2001 | Muramatsu |
| 6,294,436 | B1 | 9/2001 | Park et al. |
| 6,297,517 | B1 | 10/2001 | Matsumoto et al. |
| 6,307,775 | B1 | 10/2001 | Forbes et al. |
| 6,417,537 | B1 | 7/2002 | Yang et al. |
| 6,458,677 | B1 | 10/2002 | Hopper et al. |
| 6,465,828 | B2 | 10/2002 | Agarwal |
| 6,489,649 | B2 | 12/2002 | Kobayashi et al. |
| 6,512,274 | B1 | 1/2003 | King et al. |
| 6,614,069 | B2 | 9/2003 | Rösner et al. |
| 6,627,494 | B2 | 9/2003 | Joo et al. |
| 6,706,599 | B1 | 3/2004 | Sadd et al. |
| 6,730,960 | B2 | 5/2004 | Forbes |
| 6,768,165 | B1 | 7/2004 | Eitan |
| 6,791,883 | B2 | 9/2004 | Swift et al. |
| 6,803,272 | B1 | 10/2004 | Halliyal et al. |
| 6,844,604 | B2 | 1/2005 | Lee et al. |
| 6,858,899 | B2 | 2/2005 | Mahajani et al. |
| 6,885,058 | B2 | 4/2005 | Wils et al. |
| 6,906,366 | B2 | 6/2005 | Hsu et al. |
| 6,924,186 | B2 | 8/2005 | Sandhu et al. |
| 6,949,788 | B2 | 9/2005 | Fujiwara et al. |
| 6,963,103 | B2 | 11/2005 | Forbes |
| 7,087,954 | B2 | 8/2006 | Forbes |
| 7,109,548 | B2 | 9/2006 | Forbes et al. |
| 7,116,577 | B2 | 10/2006 | Eitan |
| 2003/0155605 | A1 | 8/2003 | Jong et al. |
| 2003/0183873 | A1 | 10/2003 | Fujiwara |
| 2004/0021170 | A1 | 2/2004 | Caywood |
| 2005/0023603 | A1 | 2/2005 | Eldridge et al. |
| 2005/0189600 | A1 | 9/2005 | Ohuchi et al. |
| 2005/0247970 | A1 | 11/2005 | Jeon et al. |
| 2006/0022252 | A1 | 2/2006 | Doh et al. |
| 2006/0270157 | A1 | 11/2006 | Joo |

FOREIGN PATENT DOCUMENTS

| | | |
|---|---|---|
| JP | 08-017945 | 1/1996 |
| JP | 8-162549 A | 6/1996 |
| JP | 9-129757 | 5/1997 |
| JP | 11-008325 | 1/1999 |
| JP | 2001-35945 A | 2/2001 |
| JP | 2002-203917 | 7/2002 |
| JP | 2003-332467 | 11/2003 |
| JP | 2006-229195 A | 8/2006 |
| JP | 2006-339624 A | 12/2006 |
| KR | 2001/0066386 A | 7/2001 |
| KR | 1020030057851 | 7/2003 |
| KR | 10-2004-0054146 A | 6/2004 |
| KR | 10-2004-0106074 A | 12/2004 |
| KR | 1020040108309 | 12/2004 |
| KR | 10-2005-0102864 A | 10/2005 |
| KR | 10-2006-0011478 A | 2/2006 |
| KR | 10-2006-0124001 A | 12/2006 |
| WO | WO 00/75997 A1 | 12/2000 |
| WO | 2001077319 A | 3/2001 |

* cited by examiner

NON-VOLATILE SEMICONDUCTOR MEMORY DEVICES AND METHODS OF FABRICATING THE SAME

RELATED APPLICATIONS

This application claims priority to Korean Patent Application No. 10-2006-0047231, Filed May 25, 2006, and claims priority to and is a continuation-in-part of parent U.S. patent application Ser. No. 11/043,485, filed Jan. 26, 2005 now U.S. Pat. No. 7,400,009, which claims the benefit of priority to Korean Patent Application No. 2002-0005622, filed on Jan. 31, 2002 and to Korean Patent Application No. 2001-0037421, filed on Jun. 28, 2001, the disclosures of each of which are hereby incorporated by reference in their entirety.

FIELD OF THE INVENTION

The present invention relates to non-volatile memory devices and methods of fabricating nonvolatile memory devices.

BACKGROUND OF THE INVENTION

Two types of non-volatile memory devices are floating gate type memory devices and floating trap type memory devices. A floating gate type memory device may include a control gate and a conductive floating gate that is isolated, by an insulating layer, from a substrate channel. Floating gate type memory devices may be programmed by storing charges as free carriers on the conductive floating gate.

Floating trap type memory devices may include a non-conductive charge storage layer between a gate electrode and a substrate. Floating trap type memory devices may be programmed by storing charges in traps in the non-conductive charge storage layer.

Floating gate type memory devices generally have a thicker tunneling insulating layer than floating trap type memory devices to provide comparable reliability for storing charges. A thicker tunneling insulating layer may result in an increased operating voltage for the memory device and an increased complexity of associated peripheral circuitry. Consequently, it may be more difficult to provide high integration density and low power consumption for floating gate type memory devices than for floating trap type memory devices.

A SONOS (silicon-oxide-nitride-oxide-semiconductor) structure of a conventional floating trap type unit memory device is shown in FIG. 1. The memory device includes a tunneling insulating layer 20, a charge storage layer 22, a blocking insulating layer 24, and a gate electrode 27 that are sequentially stacked on an active region of a P-type semiconductor substrate 10. An N$^+$ type impurity diffusion layer 28 is formed at an active region on opposite sides of the gate electrode 27. The tunneling insulating layer 20 may include a thermal oxide material and the charge storage layer 22 may include silicon nitride material.

An energy band diagram of a floating trap type unit memory device is shown in FIG. 2, taken along a line I-I' of FIG. 1. Intrinsic energy band gaps are shown for the materials corresponding to the semiconductor substrate 10, the tunneling insulating layer 20, the charge storage layer 22, the blocking insulating layer 24, and the gate electrode 27. Differences between the energy band gaps may result in potential barriers at the interfaces between the materials.

For example, the charge storage layer 22 can include silicon nitride which has an energy band gap of about 5 eV. The corresponding potential barriers between the tunneling insulating layer 20 and the charge storage layer 22 may be about 1 eV and 2 eV, respectively, for the conduction band and the valence band.

A silicon nitride layer is known to have three trap levels. A trap center of the silicon nitride layer includes a silicon atom that combines with three nitrogen atoms 20 and has one dangling bond. When no electron combines with the dangling bond (i.e., a hole combines therewith), the state may be called a first trap level $E_1$. When one electron combines with the dangling bond, the state may be called a second trap level $E_2$, which is higher than the first trap level $E_1$. When two electrons combine with the dangling bond, the state may be called a third trap level $E_3$, which is higher than the second trap level $E_2$.

A floating trap type non-volatile memory device uses trap levels, such as those found in a silicon nitride layer, for memory operations. When a positive voltage is applied on the gate electrode 27, electrons are tunneled via the tunneling insulating layer 20 to become trapped in the charge storage layer 22. As the electrons are accumulated in the charge storage layer 22, a threshold voltage of the memory device is increased, and the memory device becomes programmed.

In contrast, when a negative voltage is applied to the gate electrode 27 as shown in FIG. 3, trapped electrons are discharged to the semiconductor substrate 10 via the tunneling insulating layer 20. Concurrently, holes become trapped in the first trap level $E_1$ from the semiconductor substrate 10 by the tunneling insulating layer 20. Consequently, the threshold voltage of the unit memory device is decreased, and the memory device becomes erased.

For the memory device to be programmed, the quantity of charges from the channel should be relatively greater than the quantity of charges from the gate electrode. For example, when a positive voltage is applied to the gate electrode, if the quantity of holes provided from the gate electrode to the floating trap is equal to the quantity of electrons provided from the channel to the floating trap, negative charges are offset by positive charges and vice versa. Accordingly, the threshold voltage is not changed and programming may be precluded.

When the thickness of the silicon oxide layer, serving as a tunneling oxide layer, is 20 Å or less, current flow from direct tunneling may exceed current flow from F-N tunneling and an erase operation may occur. When a blocking oxide layer has a thickness of about 50 Å, charge may be primarily moved by F-N tunneling and the quantity of charges from the channel may be greater than the quantity of charges from the gate electrode. In contrast, when the thickness of the tunneling insulating layer is 20 Å or less and the blocking insulating layer is thicker than the tunneling insulating layer, charges may be primarily provided from the channel in erase and program operations, and the threshold voltage may be more easily controlled.

The thickness of the silicon oxide layer may affect the data retention time of the memory device. For example, when the thickness of the silicon oxide layer is 20 Å or less, charges stored in the floating trap may leak more easily and the data retention time of the memory device may be shortened. When the thickness of the silicon oxide layer is 20 Å or higher, the data retention time may be increased but the primary flow of charges to the floating trap may be by F-N tunneling. F-N tunneling may be more easily carried out as the effective mass of charge carriers becomes smaller and the electric field on the charge carrier path becomes stronger.

Conventional operations for programming and erasing a floating trap type memory device will now be described. During an early phase of a programming operation, when the tunneling insulating layer and the blocking insulating layer are oxide materials and a voltage is applied to the gate electrode, the generated electric field can be described by Equation 1 below.

$$Eot = Eob = \frac{Vg - \Phi ms - 2\Phi b}{Xot + \frac{\varepsilon(ot)}{\varepsilon(SIN)} + Xob} \quad \text{Equation 1}$$

The symbols "ot", "ob", and "SIN" represent the tunneling insulating layer, the blocking insulating layer, and the silicon nitride layer, respectively. The symbol "E" represents the electric field, "Vg" represents the voltage of a gate electrode, "Φms" represents a difference of a work function between the substrate and the gate electrode, "Φb" represents a substrate surface potential, "X" represents a thickness of the oxide layer, and "∈" represents a dielectric constant.

During the early phase of the programming operation, when a positive voltage is applied to the gate electrode, a hole is moved from the gate electrode to the floating trap and an electron is moved from the channel to the floating trap. When more electrons are provided to the gate electrode than holes, the threshold voltage is increased. As electrons become trapped in the floating trap of the charge storage layer and accumulate therein, the electric field applied to the blocking insulating layer may become stronger than the electric field applied to the tunneling insulating layer. Once stronger, trapped electrons become increasingly discharged via the blocking insulating layer, or holes become increasing injected from the gate electrode, so that growth of the threshold voltage becomes limited.

During an erasing operation, when a relatively lower voltage is applied to the gate electrode, electrons move by F-N tunneling from the gate electrode to the floating trap and holes move from the channel to the floating trap. Because the effective mass of electrons is lower than that of holes, electrons more easily flow from the gate electrode than holes from the channel. In an early phase of the erasing operation, when the floating trap of the silicon nitride layer (i.e., the charge storage layer) is uniformly filled with electrons, the quantity of charge, Q, may be negative. With a negative Q, the blocking insulating layer and the tunneling insulating layers can be described by Equations 2 and 3 below.

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob} \quad \text{Equation 2}$$

$$Eob = Eot + \frac{Q}{\varepsilon(ot)} \quad \text{Equation 3}$$

The symbols "ot", "ob", and "SIN" represent the tunneling insulating layer, the blocking insulating layer, and the silicon nitride layer, respectively. The symbol "E" represents an electric field, "Vg" represents a voltage of the gate electrode, "Φms" represents a difference of a work function between the substrate and the gate electrode, "Φb" represents a substrate surface potential, "X" represents a thickness of an oxide layer, and "Q" represents the quantity of charges at the silicon nitride layer.

When the thickness of the tunneling insulating layer is 20 Å or more, charges are moved at the tunneling insulating layer and the blocking insulating layer by F-N tunneling. During an erasing operation, the quantity of electrons provided from the gate electrode may exceed the quantity of holes provided from the channel and the floating trap can accumulate a negative charge, which may make it difficult to sufficiently decrease the threshold voltage to erase the memory.

SUMMARY OF THE INVENTION

Various embodiments of the present invention are directed to nonvolatile memory devices and related methods of fabricating nonvolatile memory devices.

In some embodiments, a nonvolatile memory device includes a tunnel insulation film on a semiconductor substrate, a charge-trapping layer on the tunnel insulation film, a block insulation film on the charge-trapping layer, and a gate electrode on the blocking insulation film. The blocking insulation film includes a stacked film structure of a high-dielectric film and a barrier insulation film. The high-dielectric film has a first potential barrier relative to the charge-trapping layer. The barrier insulation film has a second potential barrier relative to the charge-trapping layer which is higher than the first potential barrier. The blocking insulation film has a thickness in a range of about 5 Å to about 15 Å.

The barrier insulation film may include a silicon oxide film. The charge-trapping layer may include a silicon nitride film, and the barrier insulation film may include a silicon oxide film as an oxidation layer on a surface of the silicon nitride film.

Some other embodiments are directed to methods of fabricating a nonvolatile memory device. A tunnel insulation film is formed on a semiconductor substrate. A charge-trapping layer is formed on the tunnel insulation film. A blocking insulation film is formed on the charge-trapping layer as a stacked film structure. The blocking insulating film is formed from a stacked film structure of a high-dielectric film and a barrier insulation film. The high-dielectric film has a first potential barrier relative to the charge-trapping layer. The barrier insulation film has a second potential barrier relative to the charge-trapping layer which is higher than the first potential barrier. The barrier insulation film is formed to have a thickness in a range of about 5 Å to about 15 Å.

The barrier insulation film may be formed from a silicon oxide film. A surface of the charge-trapping layer may be oxidized to form the barrier insulation film, such as by applying an oxygen plasma to oxidize an upper surface of the charge-trapping layer and/or by applying radicals containing oxygen to oxidize an upper surface of the charge-trapping layer. The charge-trapping layer may be formed from a silicon nitride film, and barrier insulating film may be formed as a silicon oxide film by oxidizing a surface of the silicon nitride film.

BRIEF DESCRIPTION OF THE DRAWINGS

The accompanying figures are included to provide a further understanding of the invention, and are incorporated in and constitute a part of this specification. The drawings illustrate exemplary embodiments of the invention and, together with the description, serve to explain principles of the present invention. In the figures.

DETAILED DESCRIPTION OF EMBODIMENTS OF THE INVENTION

Figure 1:
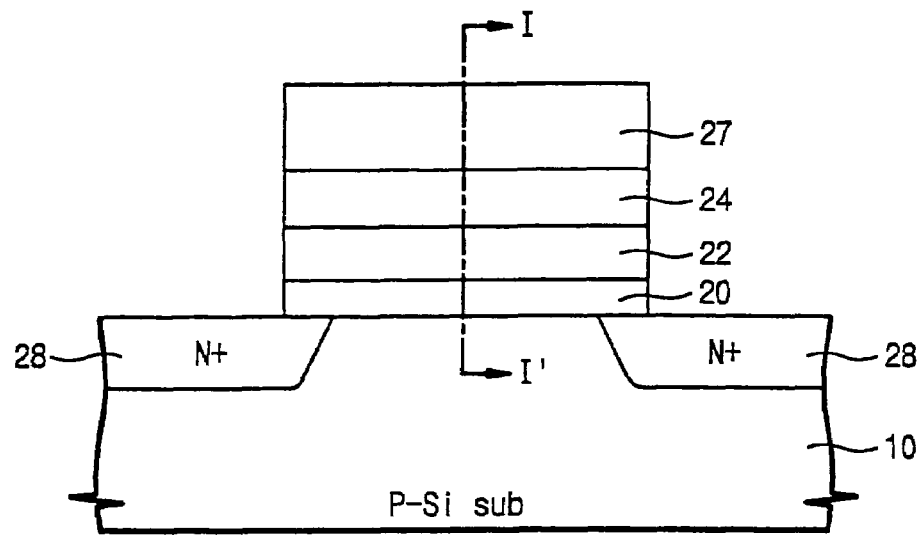
FIG. 1 is a cross-sectional view of a SONOS (silicon oxide nitride oxide semiconductor) structure of a conventional floating trap type unit memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled"to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Figure 4:
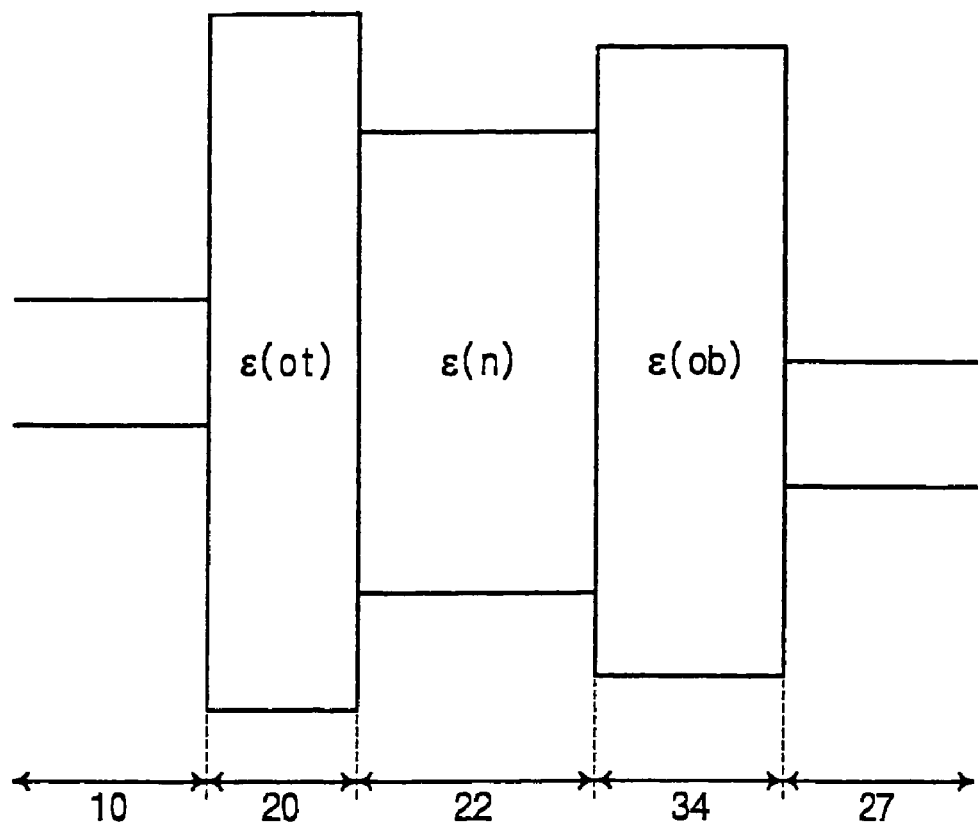
FIG. 4 is an energy band diagram of a floating trap type memory device according to some embodiments of the present invention.

An energy band diagram of a floating trap type memory device according to some embodiments of the present invention is shown in FIG. 4. The floating trap type memory device, as represented in the memory band diagram, may include a substrate 10, a tunneling insulating layer 20, a charge storage layer 22, a dielectric layer 34, and a gate electrode 27. The dielectric layer 34 may serve as a blocking insulating layer. Early in a programming operation of the memory device, electric field intensities of the tunneling insulating layer 20 and the blocking insulating layer 34 may be described by Equations 4 and 5 below.

$$Eot = \frac{Vg - \Phi ms - 2\Phi b}{Xot + Xn\frac{\varepsilon(ot)}{\varepsilon(n)} + Xob\frac{\varepsilon(ot)}{\varepsilon(ob)}} \qquad \text{Equation 4}$$

$$Eob = Eot\frac{\varepsilon(ot)}{\varepsilon(ob)} \qquad \text{Equation 5}$$

The symbols "ot", "ob", and "n" represent the tunneling insulating layer 20, the blocking insulating layer 34, and the charge storage layer 22, respectively. The symbol "E" represents an electric field, "Vg" represents a voltage of the gate electrode 27, "Φms" represents a difference of a work function between the substrate 10 and the gate electrode 27, "Φb" represents a substrate surface potential, "X"represents a thickness of an oxide layer, and "∈" represents a dielectric constant.

According to some embodiments of the present invention, a dielectric constant of the dielectric layer 34 may be higher than a dielectric constant of the tunneling insulating layer 20. A higher dielectric constant for the dielectric layer 34 may provide a higher electric field intensity for the tunneling insulating layer 20 than for the dielectric layer 34 (See Equation 5). When programming such a memory device, electrons may be more easily injected via the tunneling insulating layer 20 and a higher quantity of electrons may flow from the channel than a quantity of holes from the gate electrode 27. A result may be faster programming of the memory device.

As explained above in the background of the invention section, when programming, electrons flow from the channel to the charge storage layer 22 via the tunneling insulation layer 20 and from the charge storage layer 22 to the gate electrode 27 via the blocking insulating layer 34, and holes flow from the gate electrode 27 to the charge storage layer 22 via the blocking insulating layer 34 and from the charge storage layer 22 to the channel via the tunneling insulating layer 20.

Figure 3:
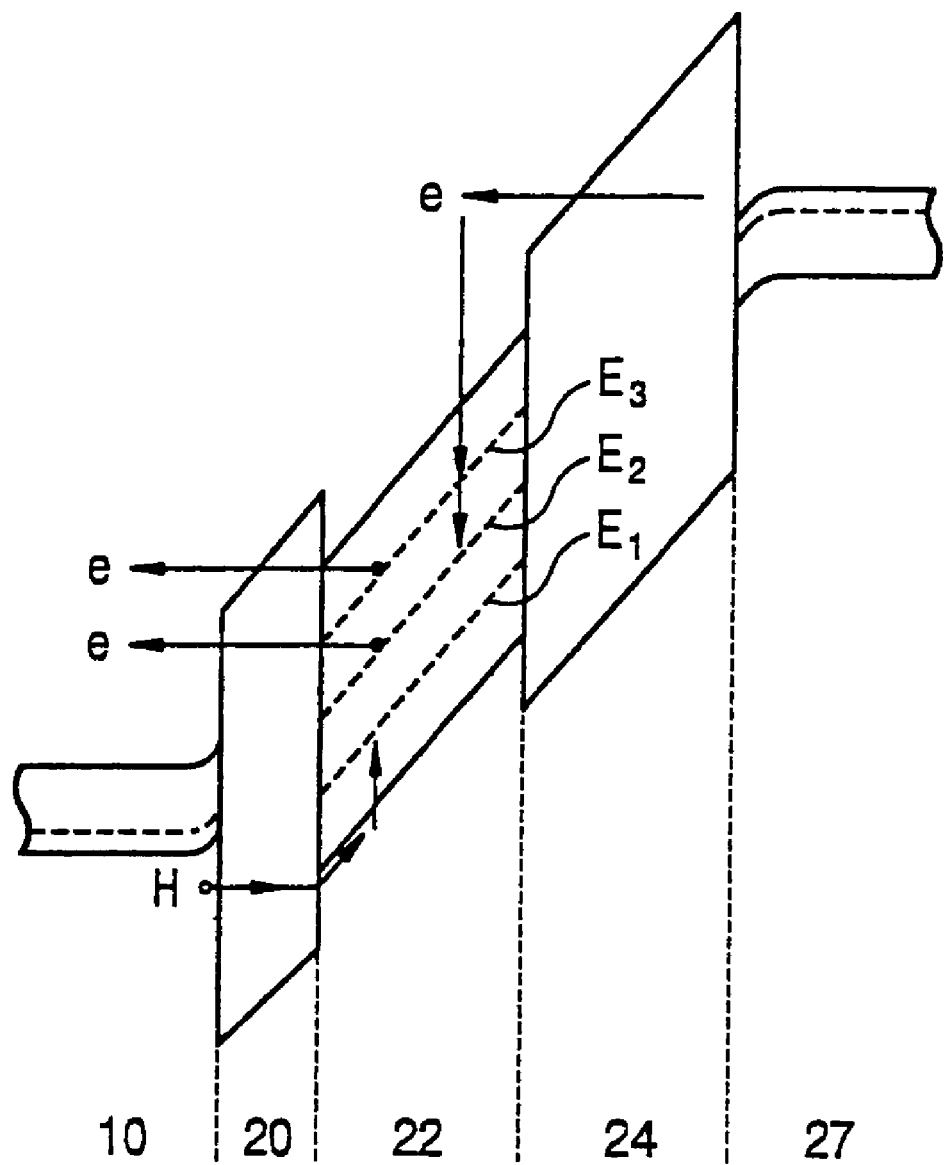
FIG. 3 is an energy band diagram of an energy band and carrier flow when a voltage is applied to a gate electrode of a conventional memory device, such as that shown in FIG. 2.

Referring to Equations 4 and 1, during programming of a floating trap type memory device according to embodiments of the present invention an electric field in the tunneling oxide layer 20 (hereinafter referred to as "$EF_P$") may be stronger than an electric field in the tunneling oxide layer 20 of FIG. 3 (hereinafter referred to as "$EF_C$"). When "$EF_C$" is positive, a positive result may be obtained when "$EF_P$" is subtracted from "$EF_C$", as shown by Equation 6.

$$\Delta Eot = \frac{(Vg - \Phi ms - 2\Phi b)\left(1 - \frac{\varepsilon(ot)}{\varepsilon(ob)}\right) Xob}{\left(Xot + Xn\frac{\varepsilon(ot)}{\varepsilon(n)} + Xob\right)\left(Xot + Xn\frac{\varepsilon(ot)}{\varepsilon(n)} + X\frac{\varepsilon(ot)}{\varepsilon(ob)}\right)} \quad \text{Equation 6}$$

Figure 2:
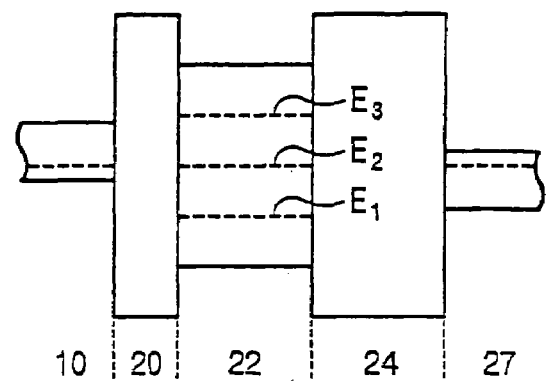
FIG. 2 is an energy band diagram of a conventional floating trap type unit memory device taken along a line of I-I' in FIG. 1.

The symbol "$\varepsilon(ob)$" represents a high dielectric constant of the dielectric layer 34. The high dielectric constant may provide a faster program operation of the memory relative to an equivalent voltage applied to a conventional memory device such as shown in FIG. 2.

The relationship of the electric fields strengths of the tunneling insulating layer 20 to the dielectric layer 34 during an erase operation may be described by Equations 7 and 8 below.

$$Eot = \frac{Vg - \Phi ms - \Phi b - Q\left(\frac{Xot}{\varepsilon(ob)} + \frac{Xn}{2\varepsilon(n)}\right)}{Xot + Xn\frac{\varepsilon(ot)}{\varepsilon(n)} + Xob\frac{\varepsilon(ot)}{\varepsilon(ob)}} \quad \text{Equation 7}$$

$$Eob = \left(Eot + \frac{Q}{\varepsilon(ot)}\right)\frac{\varepsilon(ot)}{\varepsilon(ob)} \quad \text{Equation 8}$$

The symbol "Q" represents a quantity of charges in the charge storage layer 22 and has a negative value, "$\varepsilon(ob)$" represents a dielectric constant of a dielectric layer 34, and "$\varepsilon(ot)$" represents a dielectric constant of the tunneling insulating layer 20.

When "$\varepsilon(ob)$" is sufficiently larger than "$\varepsilon(ot)$", the electric field of the tunneling insulating layer 20 may become stronger than the electric field of the dielectric layer 34. The change in the charge quantity caused by a charge carrier movement via the tunneling insulating layer 20 (i.e., inflow of channel holes and outflow of electrons from the charge storage layer 22) may be larger than the change in the charge quantity caused by a charge carrier movement via the dielectric layer 34 (i.e., inflow of electrons from the gate electrode 27). In such a case, the threshold voltage may be more easily decreased by the inflow of channel holes at the charge storage layer 22 and an erase operation may be more easily performed.

During an erase operation, the electric field applied to the tunneling insulating layer 20 of the memory device of FIG. 4 may be stronger than the electric field applied to a tunneling insulating layer 20 of the memory device of FIG. 2, as may be shown for example by Equation 6. In this manner, the speed of the erase operation may be increased.

Figure 5:
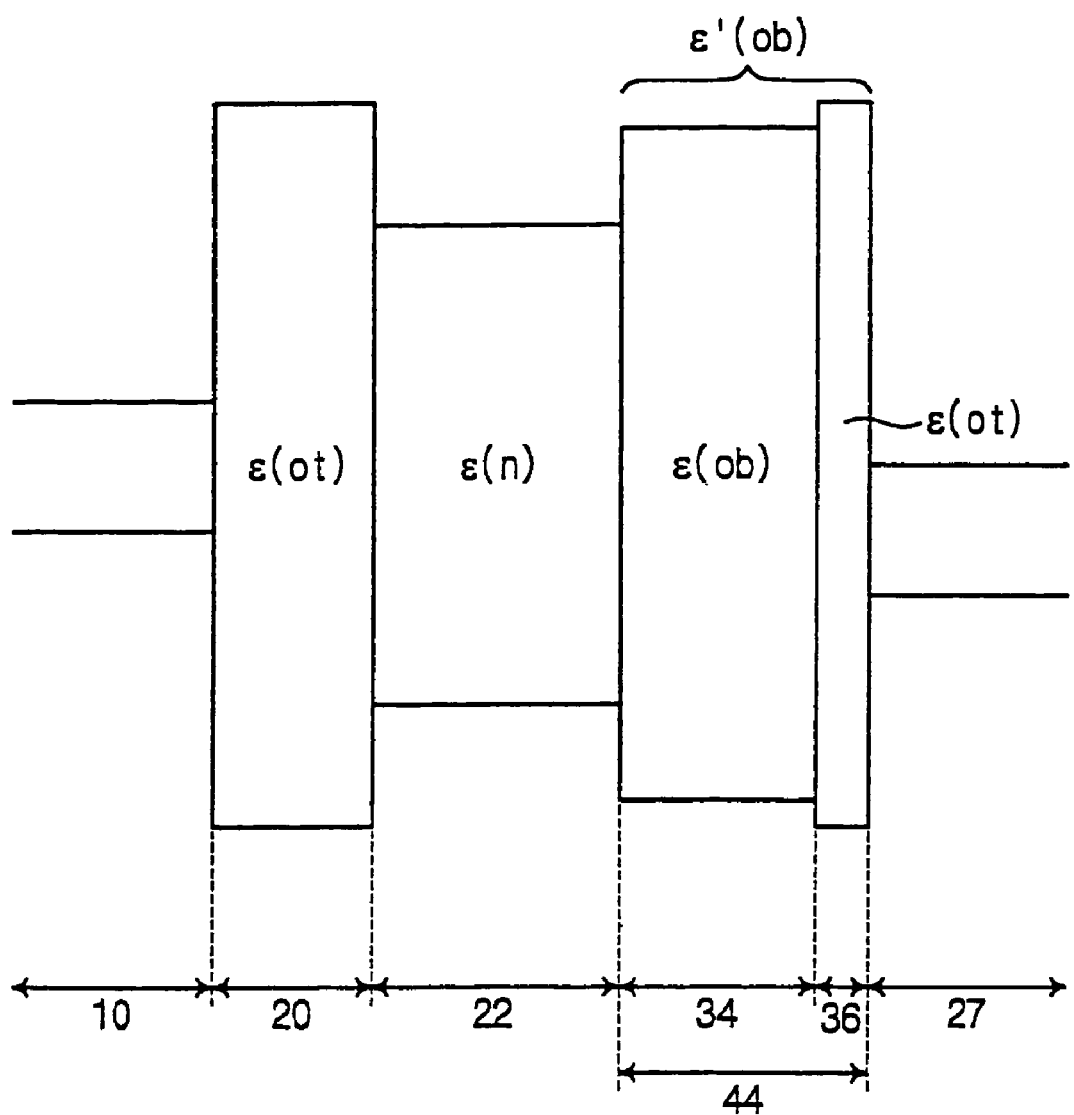
FIG. 5 is an energy band diagram of a floating trap type memory device according to additional embodiments of the present invention.

Referring to FIG. 5, a memory device according to additional embodiments of the present invention is shown. The memory device includes a semiconductor substrate 10, a tunneling insulating layer 20, a charge storage layer 22, a blocking insulating layer 44, and a gate electrode 27. The blocking insulating layer 44 may include a dielectric layer 34 and a silicon oxide layer 36 between the charge storage layer 22 and the gate electrode 27. More particularly, the silicon oxide layer 36 can be between the dielectric layer 34 and the gate electrode 27.

Figure 6:
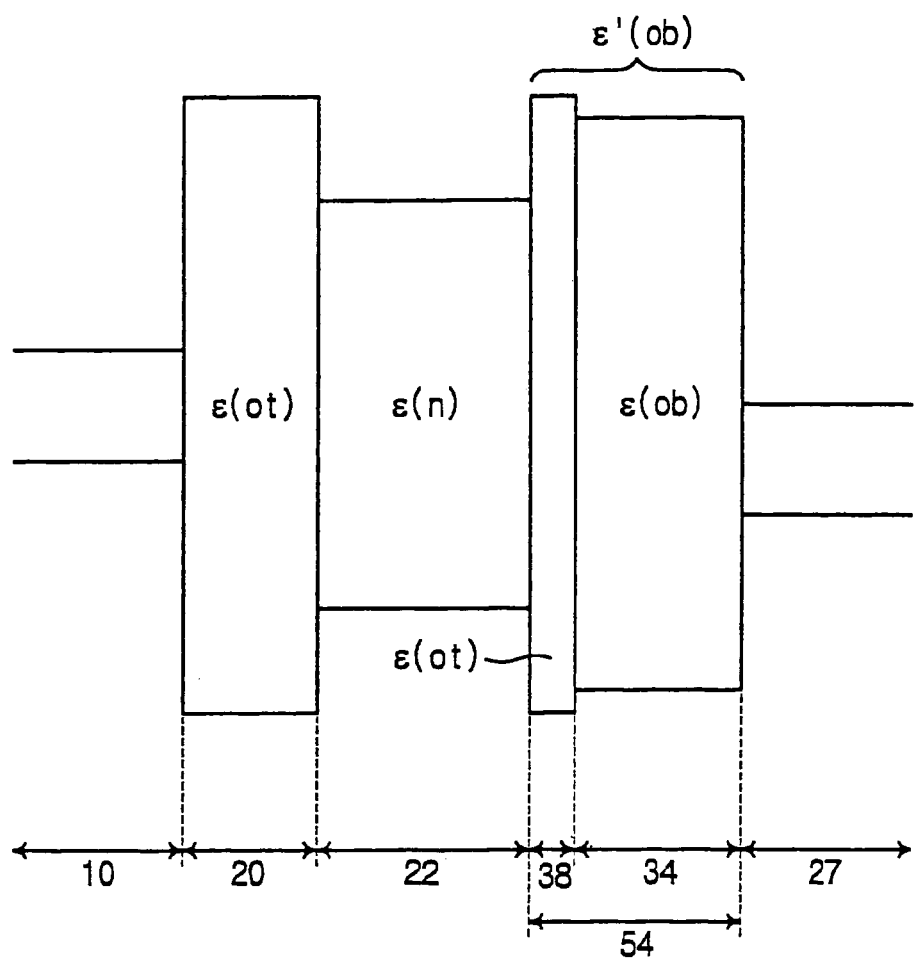
FIG. 6 is an energy band diagram of a floating trap type memory device according to additional embodiments of the present invention.

Referring to FIG. 6, a memory device according to additional embodiments of the present invention is shown. The memory device includes a semiconductor substrate 10, a tunneling insulating layer 20, a charge storage layer 22, a blocking insulating layer 54, and a gate electrode 27. The blocking insulating layer 54 includes a dielectric layer 34, having a high dielectric constant, and a silicon oxide layer 38 between the charge storage layer 22 and the gate electrode 27. More particularly, the dielectric layer 34 can be between the silicon oxide layer 38 and the gate electrode 27.

Figure 7:
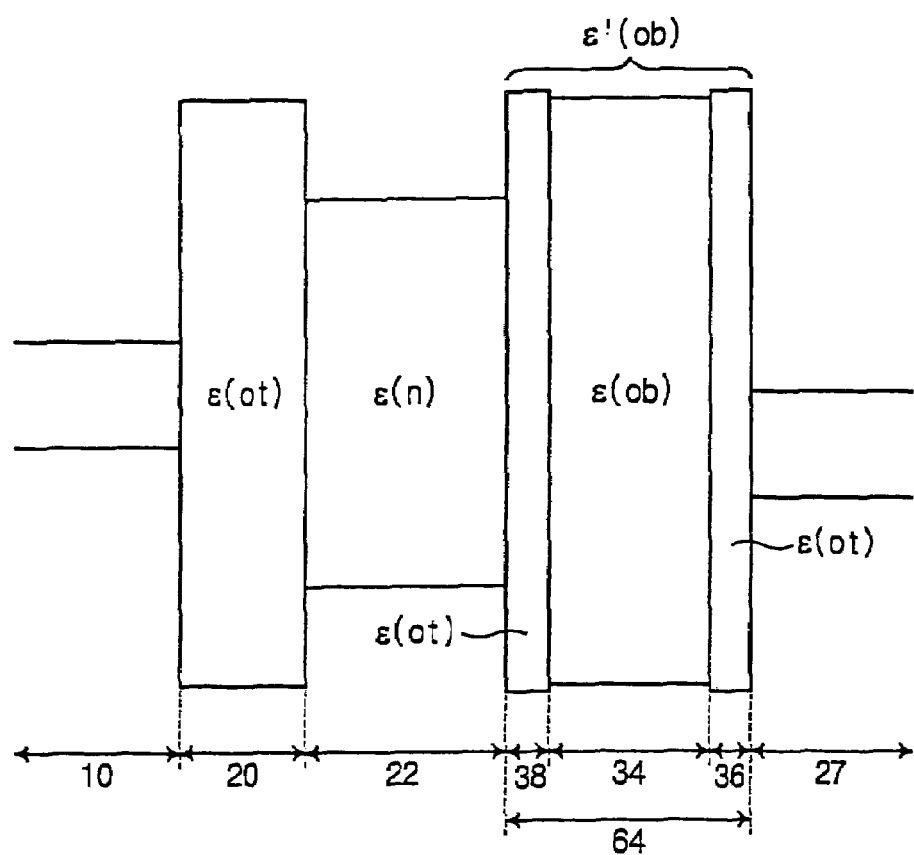
FIG. 7 is an energy band diagram of a floating trap type memory device according to additional embodiments of the present invention.

Referring to FIG. 7, a memory device according to additional embodiments of the present invention is shown. The memory device includes a semiconductor substrate 10, a tunneling insulating layer 20, a charge storage layer 22, a blocking insulating layer 64, and a gate electrode 27 disposed sequentially. The blocking insulating layer 64 includes a first silicon oxide layer 36 between a high dielectric layer 34 and a gate electrode 27 and a second silicon oxide layer 38 between the high dielectric layer 34 and the charge storage layer 22.

Equations 4 through 7 may describe the respective electric fields of the embodiments of the memory devices in FIGS. 4-7. For example, in the embodiments of FIGS. 5-7, a constant "$\varepsilon(ob)$" of the blocking insulating layers may be related to the constants of the dielectric layers and the oxide layer of the blocking insulating layers. When a blocking insulating layer of these embodiments has the same thickness as the blocking insulating layer of the memory device of FIG. 2, the electric field may become dependent upon the dielectric constant and the thickness of the dielectric layer. The oxide layer of the blocking insulating layer may increase a breakdown voltage of the blocking insulating layer. The oxide layer may also enhance an adhesiveness between the high dielectric layer and the gate electrode or between the high dielectric layer and the charge storage layer.

According to additional embodiments of the present invention, the dielectric layer 34 may comprise metallic oxide or metallic oxynitride of a group III element or group VB element in the Mendeleef Periodic Table. According to other embodiments, the dielectric layer 34 may comprise doped metal oxide or doped metal oxynitride in which metal oxide is doped with a group IV element in the Mendeleef Periodic Table. The group IV element may reduce leakage current from the memory device. The group IV element may be doped with a metal oxide of about 0.1-30 weight percent. The dielectric layer 34 may also comprise one of more of $HfO_2$, $Al_2O_3$, $La_2O_3$, $Hf_{1-x}Al_xO_y$, $Hf_xSi_{1-x}O_2$, Hf—Si-oxynitride, $ZrO_2$, $Zr_xSi_{1-x}O_2$, Zr—Si-oxynitride, and combinations thereof.

The material $Al_2O_3$ has a dielectric constant of 10 and an energy band gap of 8.3 eV and the material $ZrO_2$ has a dielectric constant of 25 and an energy band gap of 8.3 eV. The dielectric layer 34 may also comprise one or more of AlO, $Al_2O_3$, $Ta_2O_5$, $TiO_2$, $PZT[Pb(Zr, Ti)O_3]$, $PbTiO_3$, $PbZrO_3$, $PZT[(Pb, La)(Zr, Ti)O_3]$, PbO, $SrTiO_3$, $BaTiO_3$, $V_2O_5$, BST $[(Ba, Sr)TiO_3]$, $SBT(SrBi_2Ta_2O_9)$, $Bi_4Ti_3O_{12}$, and combinations thereof.

The charge storage layer 22 may comprise one or more of $Si_3N_4$, silicon oxynitride, silicon-rich oxide, and other ferroelectric materials.

Figure 8:
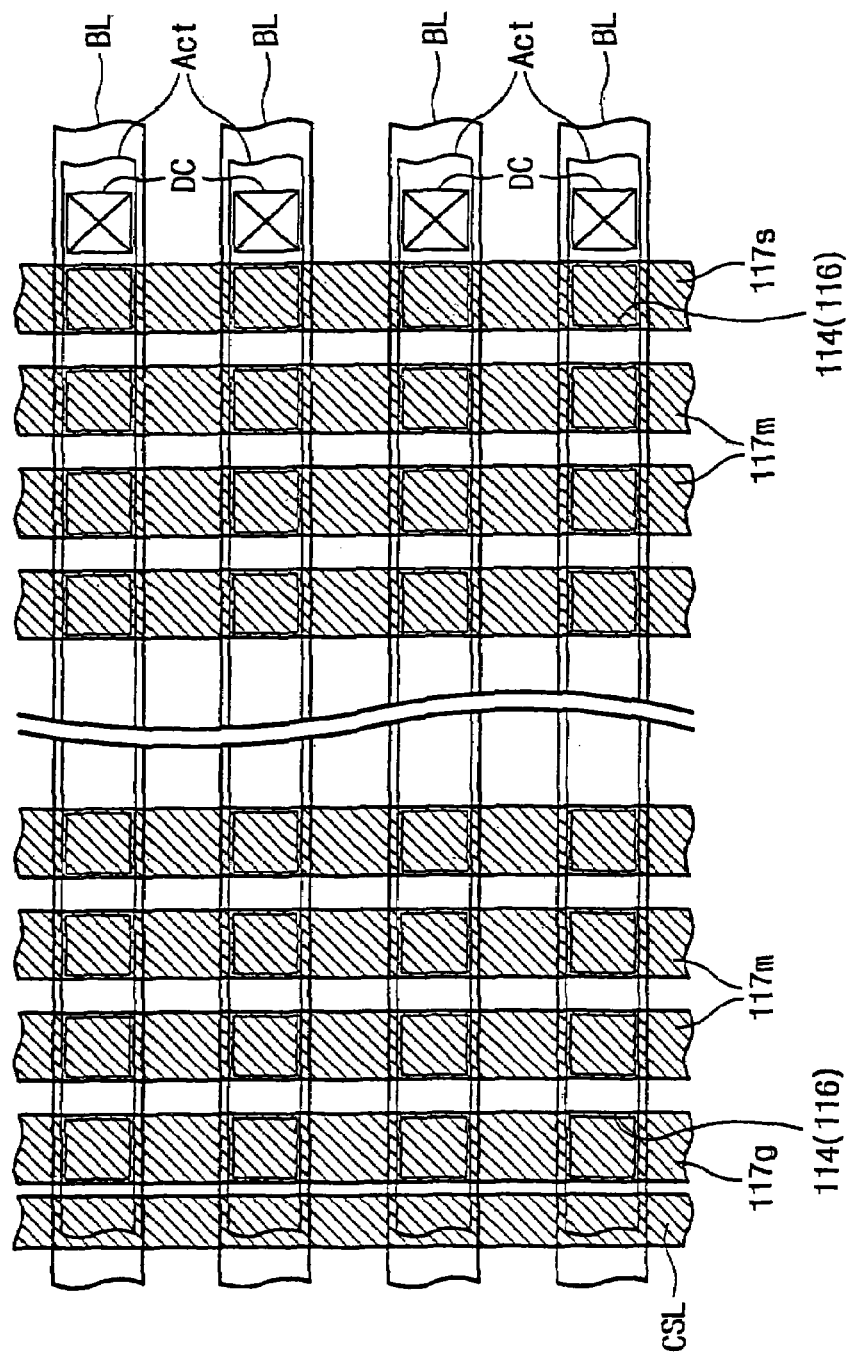
FIG. 8 is a plan view of a memory device according to some embodiments of the present invention.
Figure 9:
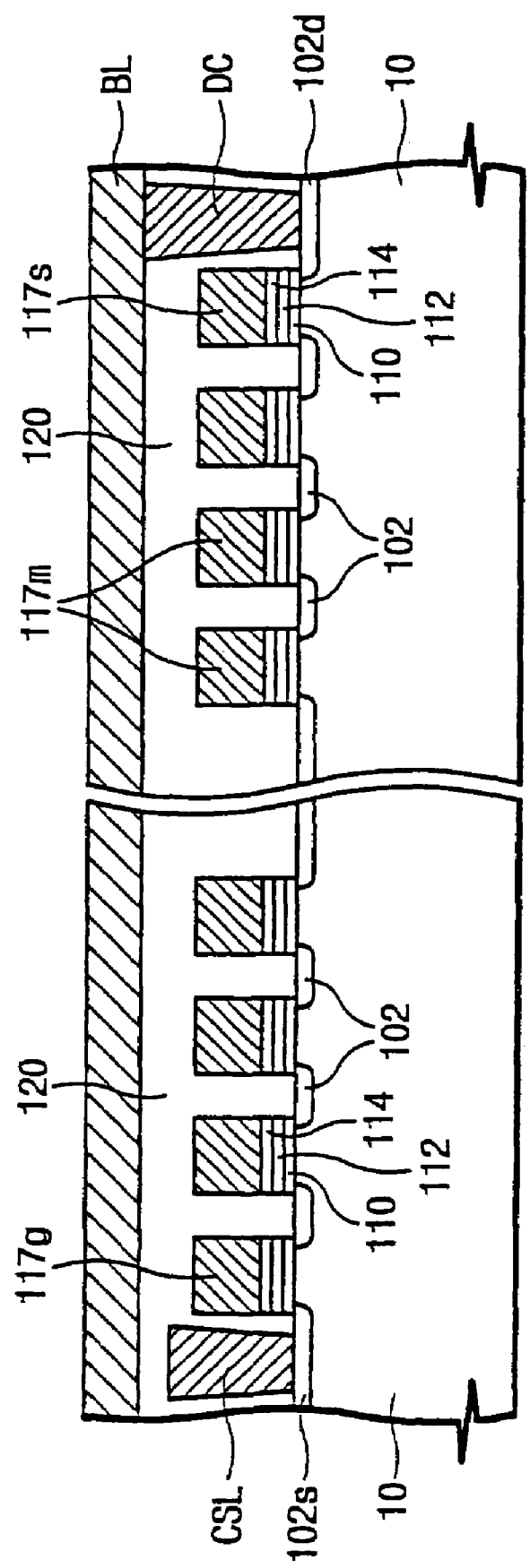
FIG. 9 is a cross-sectional view along a bit line of a memory device, such as the memory device of FIG. 8, according to some embodiments of the present invention.
Figure 10:
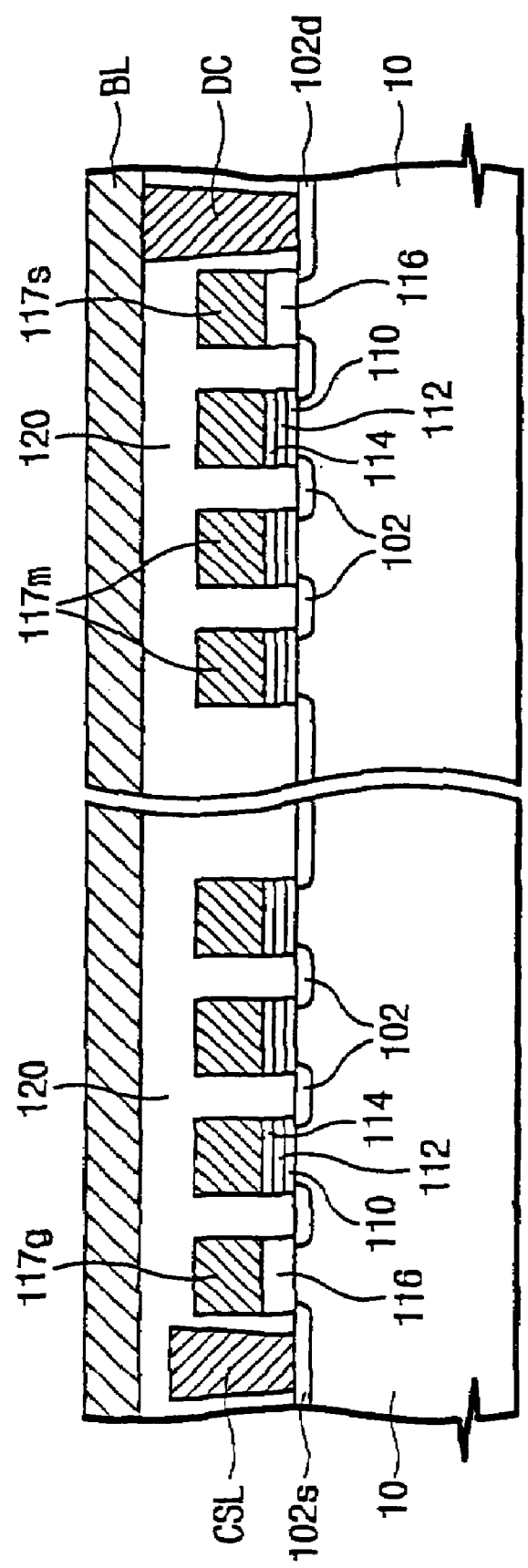
FIG. 10 is a cross-sectional view along a bit line of a memory device, such as the memory device of FIG. 8, according to additional embodiments of the present invention.

Referring to FIGS. 8-10, memory devices according to additional embodiments of the invention are shown. A plurality of active regions ACT are disposed on a semiconductor substrate 10. The active regions ACTs are parallel with one another along one direction of the substrate 10. A common source line CSL crosses over the active regions ACT. Bitline plugs DC are connected to the respective active regions ACT and separated from the common source line CSL by a predetermined distance. The bitline plugs DCs are parallel to the common source line CSL.

A string selection gate electrode 117s and a ground selection gate electrode 117g are parallel with each other, and cross over the active regions ACTs between the common source line CSL and the bitline plugs DCs. The string selection gate electrode 117s is adjacent to the bitline plugs DCs, and the ground selection gate electrode 117g is adjacent to the common source line CSL.

Between the string selection gate electrode 117s and the ground selection gate electrode 117g, a plurality of memory gate electrodes 117m cross over the active regions ACTs. The memory gate electrodes 117m are parallel with one another. A tunneling insulating layer 110, a charge storage layer 112, and a blocking insulating layer 114 are sequentially stacked between the active regions ACTs and the memory gate electrodes 117m. The tunneling insulating layer 110, the charge storage layer 112, and the blocking insulating layer 114 can comprise the same materials as previously described.

An impurity-doped region 102 is on opposite sides of the string selection gate electrode 117s, the ground selection gate electrode 117g, and the memory gate electrodes 117m. The common source line CSL is connected to the respective impurity-doped region (source region) 102s that is adjacent to the ground selection electrode 117g. An interlayer insulating film 120 covers the surface of a semiconductor substrate including the gate electrodes 117g, 117m, and 117s and the common source line CSL. The bitline plugs DCs are connected to impurity-doped regions (drain regions) 102d adjacent to the string selection gate 117s. A plurality of bitlines BLs are formed on the interlayer insulating film 120 to cross over the gate electrodes 117g, 117m, and 117s. The bitlines BLs are electrically connected to the bitline plug DC.

Memory cells may be provided at intersections of the respective memory gate electrodes 117m and the active regions ACTs. Selection transistors may be provided at intersections of the respective selection gates 117s and 117g and the respective active regions ACTs.

As shown in FIG. 9, the memory device may include a tunnel insulating layer 110, a charge storage layer 112, and a blocking insulating layer 114 sequentially stacked to be between the ground selection gate electrode 117g and the string selection gate electrode 117s and the active regions (ACTs of FIG. 8). A negative voltage may be applied to the ground selection gate electrode 117g and the string selection gate electrode 117s to lower the threshold voltage of the selection transistor during memory operations.

According to further embodiments, as shown in FIG. 10, the memory device can include a gate insulating layer 116 between each of the ground selection gate electrode 117g and the string selection gate electrode 117s and the active regions (ACTs of FIG. 8). The gate insulating layer 116 can comprise silicon oxide, silicon oxynitride, or a combination thereof.

Figure 11:
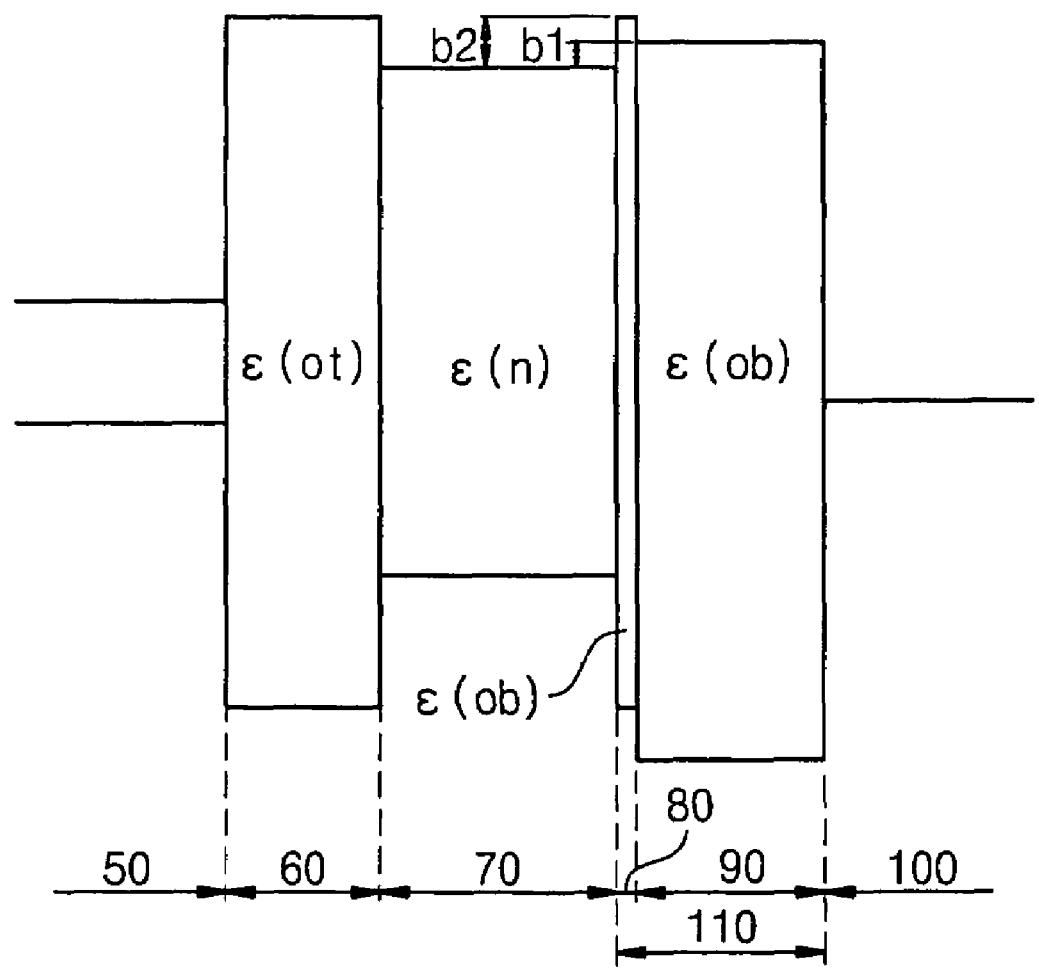
FIG. 11 is an energy band diagram of a nonvolatile memory device in accordance with a first embodiment of the invention.

FIG. 11 is an energy band diagram of a nonvolatile memory device in accordance with a first embodiment of the invention.

Referring to FIG. 11, the nonvolatile memory device includes a semiconductor substrate 50, a tunnel insulation film 60, a charge-trapping layer 70, a blocking insulation film 110, and a gate electrode 100. The blocking insulation film 110 is formed as a stacked structure of a barrier insulation film 80 and a high-dielectric film 90. As illustrated, the high-dielectric film 90 has a potential barrier b1 relative to the charge-trapping film 70 and the barrier insulation film 80 has a potential barrier b2 relative to the charge-trapping film 70. The potential barrier b2 is greater than the potential barrier b1 of the high-dielectric film 90. For instance, an aluminum oxide film (which the high-dielectric film 90 may include) has a valence band with a barrier of 0.4 eV relative to a silicon nitride film, while a silicon oxide film (which the barrier insulating film 80 may include) has a valence band with a higher barrier of 1.1 eV relative to a silicon nitride film.

The thickness of the barrier insulation film 80 affects charge tunneling through the barrier insulation film 80 during a write-in (write) operation, and affects charge tunneling through the barrier insulating film 80 during an erase operation. Consequently, it may be important to control the thickness of the barrier insulation film 80 during fabrication to avoid or prevent a reduction in the rate at which writing and/or erasing operations can be carried out.

Figure 12:
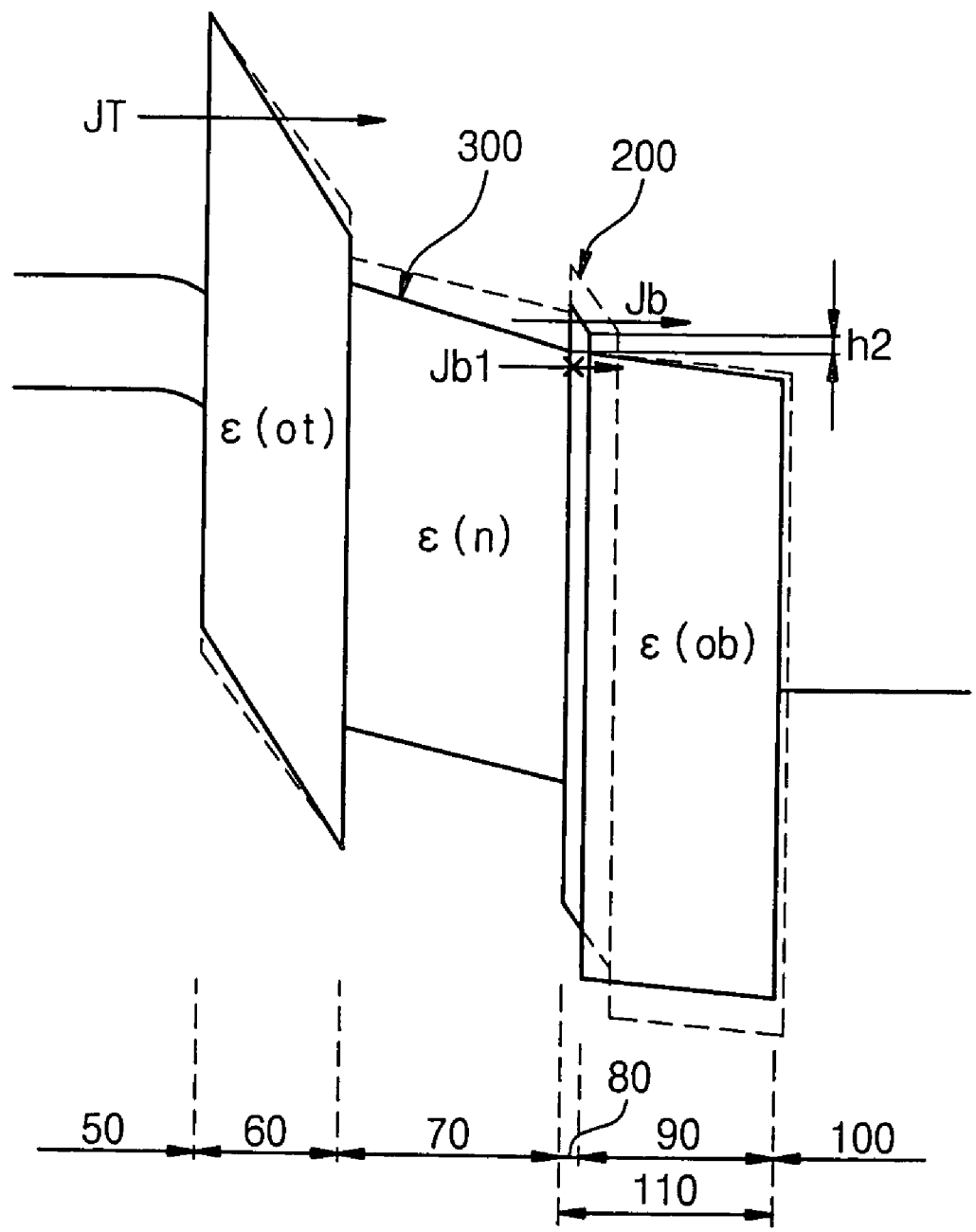
FIG. 12 is an energy band diagram during a write-in operation of a nonvolatile memory device in accordance with the first embodiment of the invention.

FIG. 12 is an energy band diagram during a write-in operation of a nonvolatile memory device in accordance with the first embodiment of the invention.

As illustrated FIG. 12, when the barrier insulation film 80 is relatively thinner (as indicated by solid lines), an energy level causes FN tunneling increases from the edge of the valence band of the charge-trapping layer by a level h2. Accordingly, even though electrons excited at the valence band of the charge-trapping layer move through the barrier insulation film 80 by means of an FN-tunneling, as indicated by the arrow Jb, electrons held in the charge-trapping layer are restrained from tunneling through the barrier insulation film 80, as indicated by the arrow Jb1.

In accordance with some embodiments of the invention, the barrier insulation film 80 functions to retain information in a data retention mode (i.e., retaining stored information in the memory device), and a thickness of the barrier insulating film 80 is controlled during fabrication to have a minimum thickness that reduces or minimizes a reduction in the rate at which writing and/or reading operations can be carried out in the associated memory device. In some embodiments, the thickness of the barrier insulation film is controlled to be in a range of about 5 Angstroms (Å) to about 15 Å.

Figure 13:
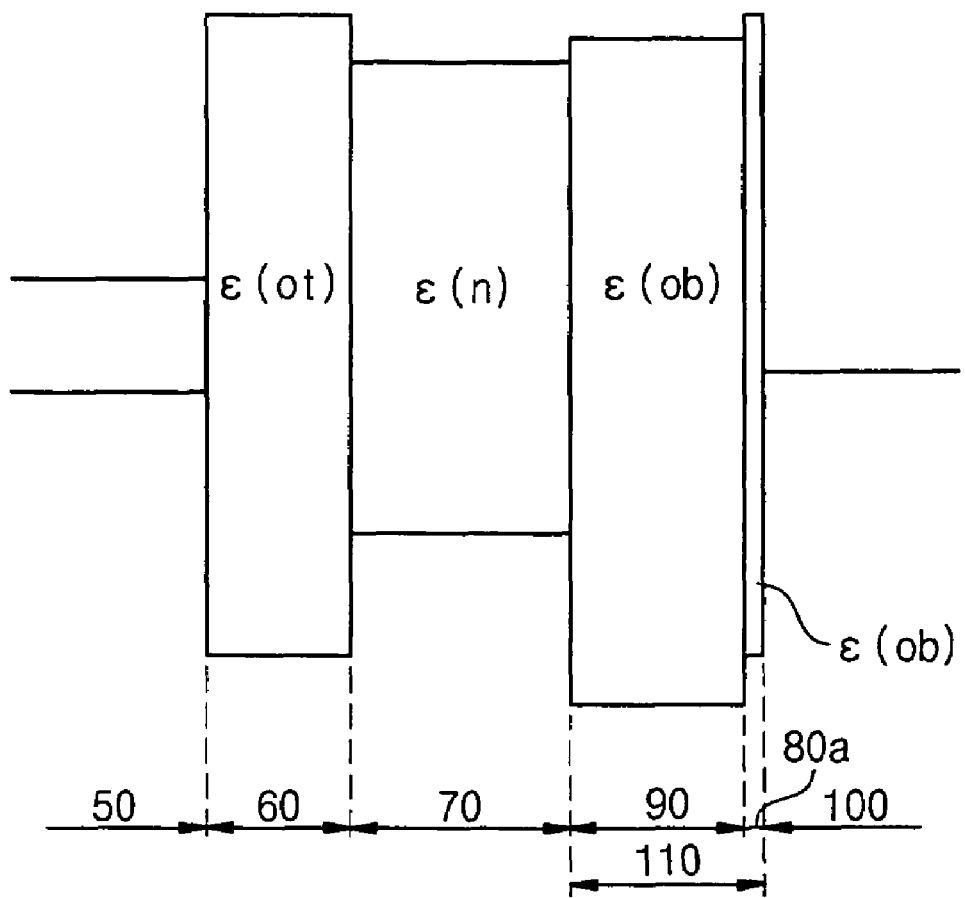
FIG. 13 is an energy band diagram of a nonvolatile memory device in accordance with a second embodiment of the invention.
Figure 14:
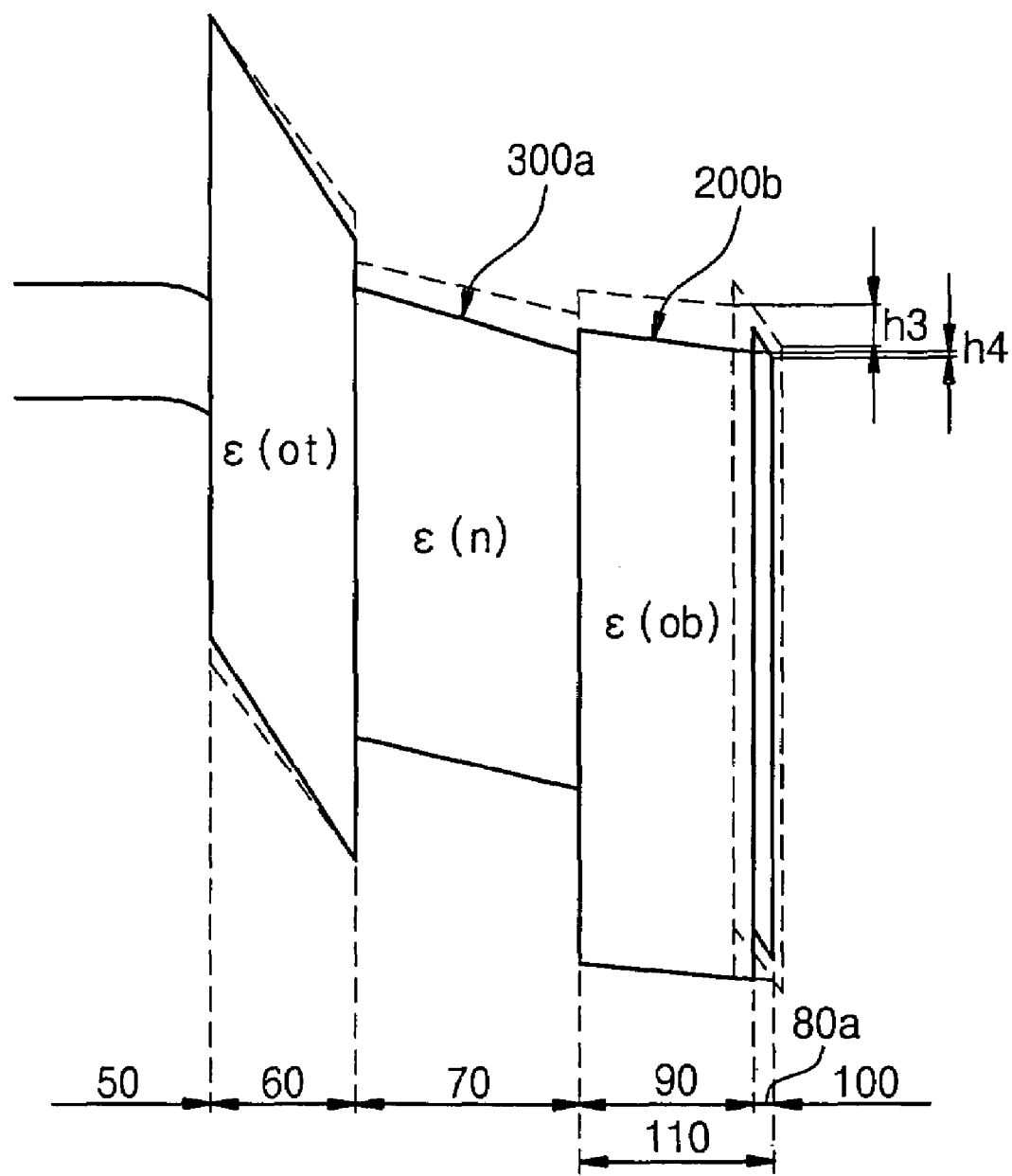
FIG. 14 is an energy band diagram during a write-in operation of a nonvolatile memory device in accordance with the second embodiment of the invention.

FIG. 13 and FIG. 14 are energy band diagrams of a nonvolatile memory device in accordance with a second embodiment of the invention.

Referring to FIG. 13, in the nonvolatile memory device according to the second embodiment, a barrier insulation film 80a is disposed between the high-dielectric film 90 and the gate electrode 100. In a retention mode, electrons, which are present in the valence band of the high-dielectric film 90 above the potential barrier of the high-dielectric film 90, can be restrained from moving toward the gate electrode 100 by a potential barrier of the barrier insulation film 80a.

Referring to FIG. 14, during a write-in operation, a write-in voltage is applied between the semiconductor substrate 50 and the gate electrode 100. When the barrier insulation film 80a is relatively thicker (as indicated by the broken lines), an energy level, at a location where the FN tunneling occurs in the barrier insulation film 80a, is lower than the edge of the valence band of the high-dielectric film 90 by a level h3. Consequently, electrons at the valence band of the high-dielectric film 90 and electrons trapped in the high-dielectric film 90 can FN-tunnel through the barrier insulation film 80a. In contrast, when the barrier insulation film 80a is relatively thinner (as indicated by the solid lines), an energy level, at a location where the FN tunneling occurs in the barrier insulation film 80a, is higher than the edge of the valence band of the high-dielectric film 90 by a level h4 and, thereby, restrains charge tunneling through the barrier insulation film 80a.

Figure 15:
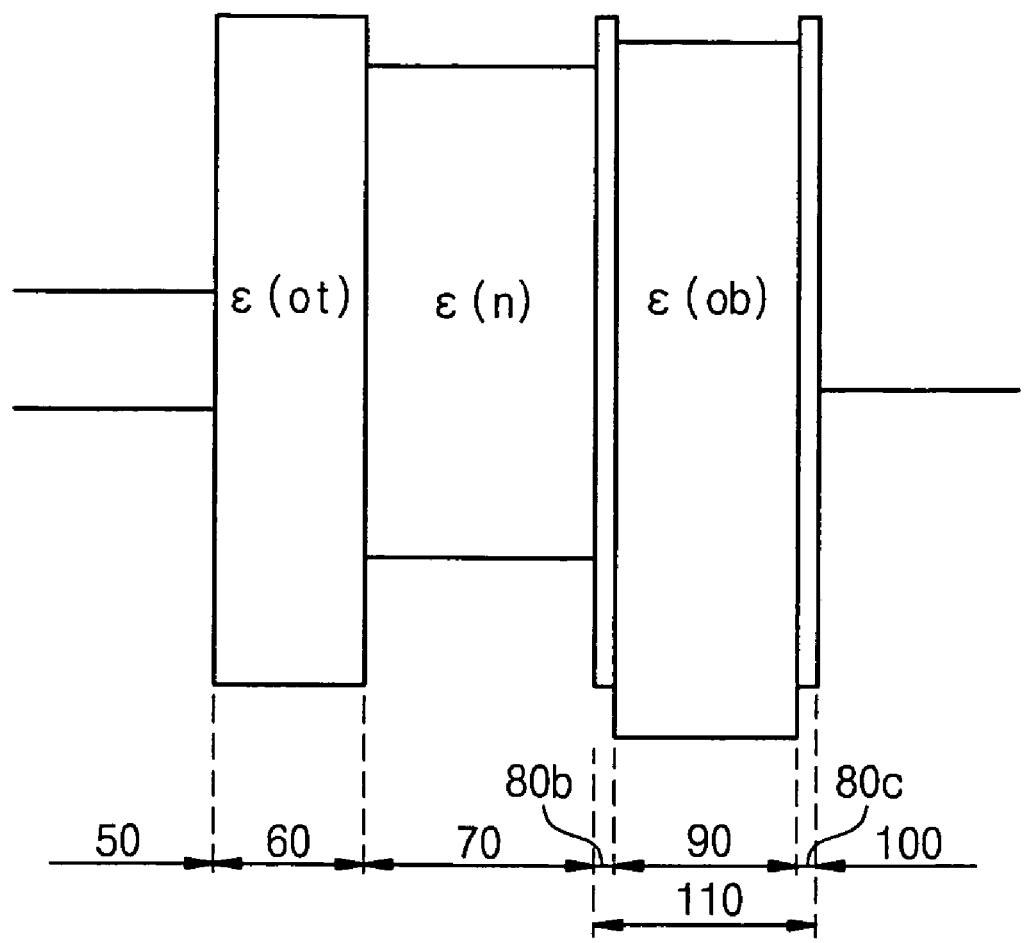
FIG. 15 is an energy band diagram of a nonvolatile memory device in accordance with a third embodiment of the invention.
Figure 16:
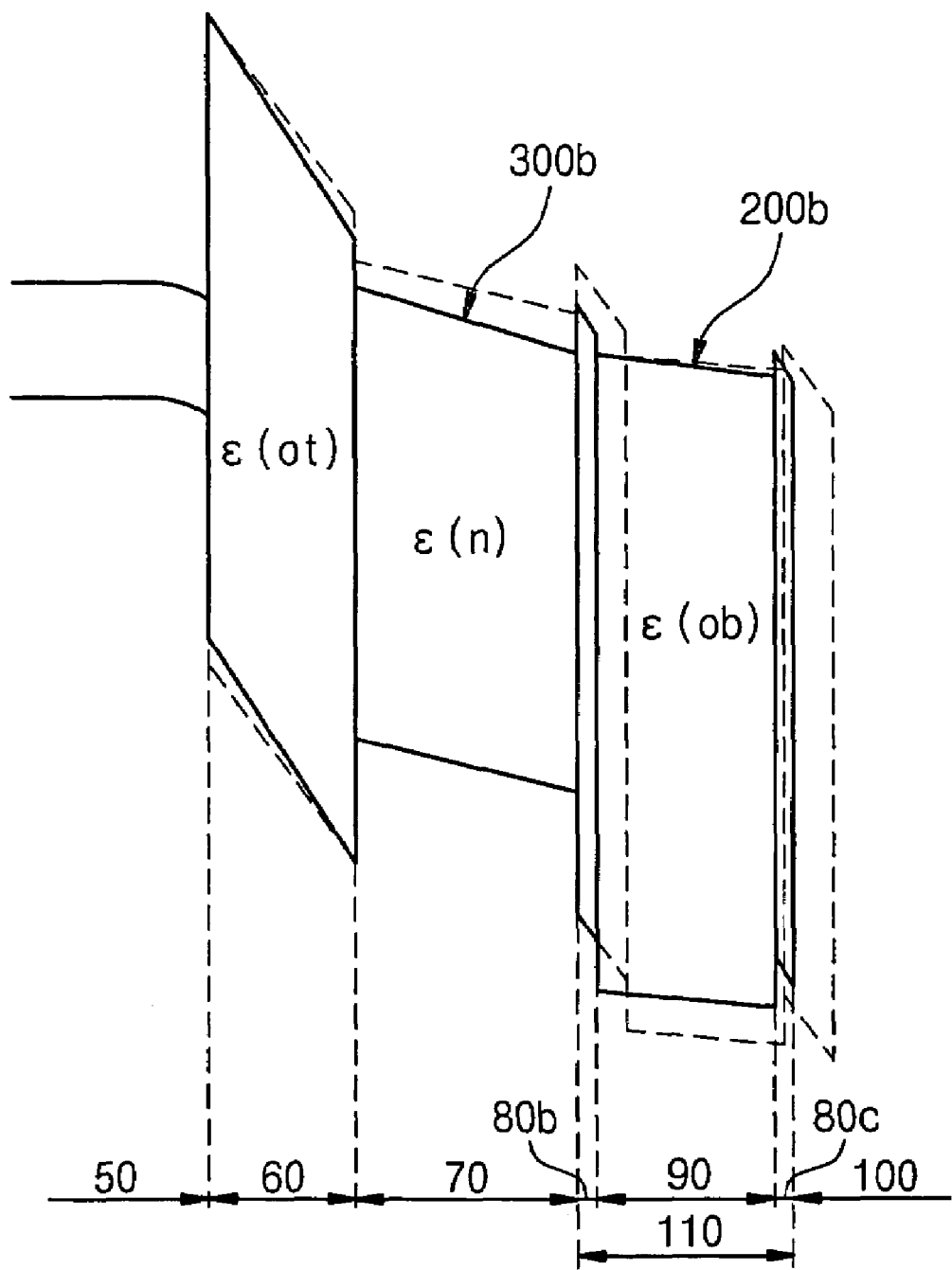
FIG. 16 is an energy band diagram during a write-in operation of a nonvolatile memory device in accordance with the third embodiment of the invention.

FIG. 15 and FIG. 16 are energy band diagrams of a nonvolatile memory device in accordance with a third embodiment of the invention.

Referring to FIG. 15, in the nonvolatile memory device according to the third embodiment, a first barrier insulation film 80b is between the charge-trapping layer 70 and the high-dielectric film 90, and a second barrier insulation film 80c is between the high-dielectric film 90 and the gate electrode 100. In a retention mode, tunneling of electrons in the charge-trapping layer 70 is interrupted by a potential barrier of the first barrier insulation film 80b, while tunneling of electrons in the valence band of the high-dielectric film 90 is interrupted by a potential barrier of the second barrier insulation film 80c, and are thereby restrained from moving to the gate electrode 100.

Referring to FIG. 16, during a write-in operation, a write-in voltage is applied between the semiconductor substrate 50 and the gate electrode 100. When the first and second barrier insulation films 80b and 80c are relatively thicker, energy levels, at a location where the FN tunneling occurs in the first and second barrier insulation films 80b and 80c, are lower than the edges of the valence bands of the charge-trapping layer 70 and the high-dielectric film 90, respectively, by a predetermined level. In contrast, when the first and second barrier insulation films 80b and 80c are relatively thinner, energy levels, at a location where the FN tunneling occurs in the first and second barrier insulation films 80b and 80c, are higher than the edges of the valence bands of the charge-trapping layer 70 and the high-dielectric film 90, respectively, by a predetermined level and thereby restrains charge tunneling through the first and second barrier insulation films 80b and 80c.

Figure 17:
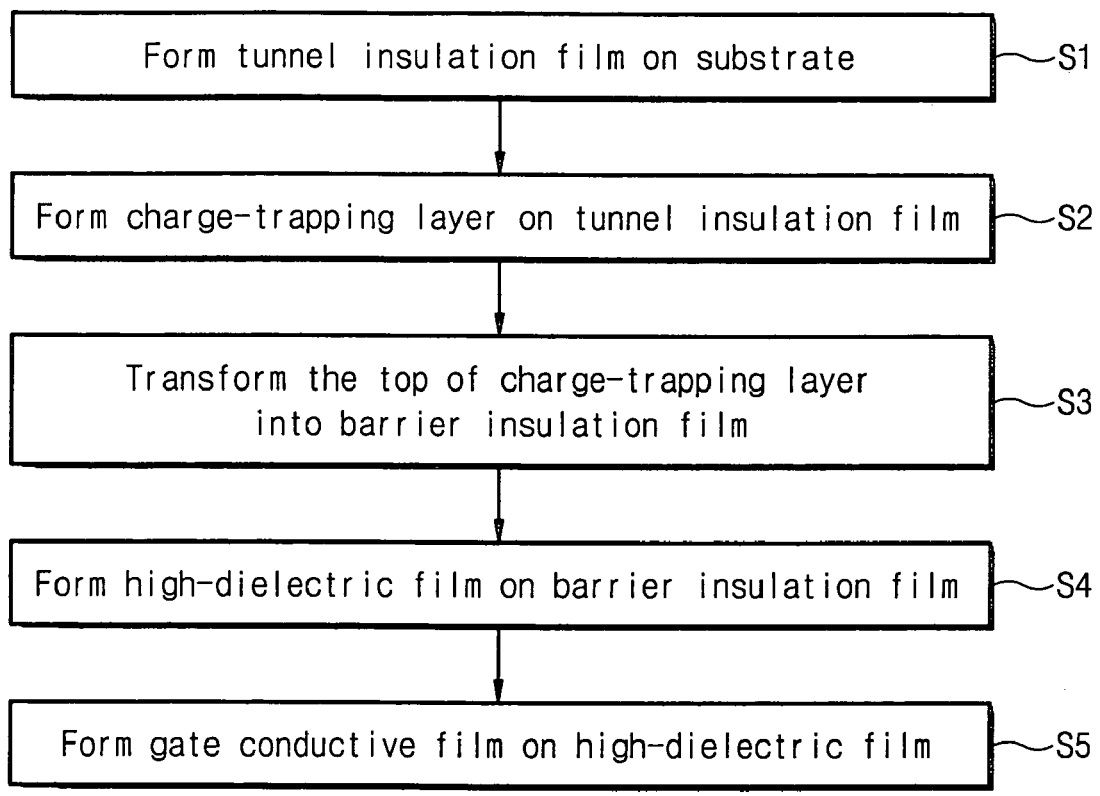
FIG. 17 is a flow chart showing methods of fabricating nonvolatile memory devices in accordance with various embodiment of the invention.

FIG. 17 is a flow chart showing methods of fabricating a nonvolatile memory device in accordance with various embodiments of the invention.

Referring to FIG. 17, the tunnel insulation film 60 is formed on the semiconductor substrate 50 (step S1). The tunnel insulation film 60 may, for example, be formed of a silicon oxide film or a multi-level insulation film including a silicon oxide film. The charge-trapping layer 70 is then formed on the tunnel insulation film 60 (step S2). The charge-trapping layer 70 may be formed of an insulation film including a high density of trap sites and/or an insulation film embedding conductive nano-particles. For example, the charge-trapping layer 70 may be formed of a silicon nitride film or a silicon nitride film having nano-particles therein.

The top of the charge-trapping layer 70 is then oxidized so as to be transformed into the barrier insulation film 80a (step S3). The barrier insulation film 80a can be formed from silicon oxide by oxidizing the top of the charge-trapping layer 70 with oxygen plasma and/or radicals including oxygen. For example, when the charge-trapping layer (70) is formed of silicon nitride, a silicon oxide film can be formed by plasma-treating the top of the silicon nitride film and/or radical-processing the top of the silicon nitride film with oxygen or hydroxyl radicals. By forming the silicon oxide film with such plasma and/or radicals, the barrier insulation film 80a may be formed having a thickness of between about 5 Å and about 15 Å.

Alternatively, the barrier insulation film 80a may be formed by an atomic layer deposition (ALD) process. When using an ALD process, the quality of silicon oxide film used for the barrier insulation film 80a may become more important to control. The silicon oxide film formed by way of plasma or radical treatment may have a high interface characteristic relative to the silicon nitride film in the charge-trapping layer 70, and may reliably form the barrier insulation film 80a. The ALD process may be carried out directly on the charge trapping layer to more reliably form the barrier insulation film.

As a modification of the embodiments shown in FIG. 10, the barrier insulation film 80a may be formed on the high-dielectric film 90. Also in these modified embodiments, the barrier insulation film 80a may be formed by oxidizing the top of the high-dielectric film 90 with plasma or radicals. By oxidizing the top of the high-dielectric film, as shown in FIG. 13, a nonvolatile memory device may be fabricated with a thin barrier insulation film having a thickness in a range of about 5 Å to about 15 Å.

In some other embodiments of the invention, the fabrication steps for oxidizing the top of the charge-trapping layer 70 may be carried out after depositing the charge-trapping layer 70. The fabrication steps for oxidizing the top of the high-dielectric film 90 may be carried out after depositing the high-dielectric film 90. Accordingly, as illustrated in FIG. 8, the first barrier insulation film 80b may be formed between the charge-trapping layer 70 and the high-dielectric film 90, and the second barrier insulation film 80c may be formed between the high-dielectric film 90 and the gate electrode film 100.

By using the high-dielectric film as the blocking insulation film, an electric field generated at the blocking insulation film during write-in operations and erasing operations may be reduced, which may enhance the rate at which writing and/or erasing operations may be carried out.

Further, by forming the blocking insulation film from a stacked film structure of the high-dielectric film and the barrier insulation film, and where the high-dielectric film has a first potential barrier relative to the charge-trapping layer and the barrier insulation film has a second potential barrier relative to the charge-trapping layer which is higher than the first potential barrier, it may be possible to substantially inhibit/prevent charges from vanishing into the barrier insulation film of the charge-trapping layer during a retention mode.

By minimizing a thickness of the barrier insulation film, the valence band of the high-dielectric film may be less affected, and FN tunneling through the barrier insulation film may be less inhibited during a write-in operation. Thus, write-in and erasing operations may be carried out at a relatively high rate compared to a case where the blocking insulation film is formed of a single layer with a high-dielectric material.

The above-disclosed subject matter is to be considered illustrative, and not restrictive, and the appended claims are intended to cover all such modifications, enhancements, and other embodiments, which fall within the spirit and scope of the present invention. Thus, the scope of the present invention is to be determined by the broadest permissible interpretation of the following claims and their equivalents, and shall not be restricted or limited by the foregoing detailed description.

What is claimed is:

1. A nonvolatile memory device comprising:
   a tunnel insulation film on a semiconductor substrate;
   a charge-trapping layer on the tunnel insulation film;
   a blocking insulation film on the charge-trapping layer; and
   a gate electrode formed on the blocking insulation film,
   wherein the blocking insulation film comprises a stacked film structure of a high-dielectric film and a barrier insulation film, the high-dielectric film has a first potential barrier relative to the charge-trapping layer, the barrier insulation film has a second potential barrier relative to the charge-trapping layer which is higher than the first potential barrier, and the blocking insulation film has a thickness in a range of about 5 Å to about 15 Å.

2. The nonvolatile memory device as set forth in claim 1, wherein the barrier insulation film comprises the silicon oxide film.

3. The nonvolatile memory device as set forth in claim 2, wherein:
   the charge-trapping layer comprises a silicon nitride film; and
   the barrier insulation film comprises the silicon oxide film as an oxidation layer on a surface of the silicon nitride film.

4. A method of fabricating a nonvolatile memory device, the method comprising:
   forming a tunnel insulation film on a semiconductor substrate;
   forming a charge-trapping layer on the tunnel insulation film;
   forming a blocking insulation film on the charge-trapping layer as a stacked film structure, wherein the blocking insulating film is formed from a stacked film structure of high-dielectric film and a barrier insulation film, wherein the high-dielectric film has a first potential barrier relative to the charge-trapping layer, the barrier insulation film has a second potential barrier relative to the charge-trapping layer which is higher than the first potential barrier, and the barrier insulation film is formed to have a thickness in a range of about 5 Å to about 15 Å.

5. The method as set forth in claim 4, wherein the barrier insulation film is formed as the silicon oxide film.

6. The method as set forth in claim 4, wherein forming the blocking insulation film comprises oxidizing a surface of the charge-trapping layer to form the barrier insulation film.

7. The method as set forth in claim 6, wherein oxidizing a surface of the charge-trapping layer to form the barrier insulation film comprises applying an oxygen plasma to oxidize an upper surface of the charge-trapping layer.

8. The method as set forth in claim 6, wherein oxidizing a surface of the charge-trapping layer to form the barrier insulation film comprises applying radicals containing oxygen to oxidize an upper surface of the charge-trapping layer.

9. The method as set forth in claim 6, wherein:
   forming a charge-trapping layer comprises forming a silicon nitride film as the charge-trapping layer; and
   the barrier insulation film is formed as the silicon oxide film by oxidizing a surface of the silicon nitride film.

10. The method as set forth in claim 4, wherein the barrier insulation film is formed by an atomic layer deposition (ALD) process on the charge trapping layer.

* * * * *